United States Patent [19]

Sakamoto et al.

[11] 3,813,606

[45] May 28, 1974

[54] TRANSISTOR CIRCUIT

[75] Inventors: Yoshio Sakamoto; Shinsuke Iguchi, both of Tokyo, Japan

[73] Assignee: Hitachi, Ltd., Tokyo, Japan

[22] Filed: June 30, 1972

[21] Appl. No.: 268,078

[30] Foreign Application Priority Data

July 9, 1971 Japan ................................ 46-59538

[52] U.S. Cl. ......................... 330/13, 330/15, 330/17, 330/38 M

[51] Int. Cl. ............................................. H03f 3/18

[58] Field of Search ................ 330/13, 15, 17, 38 M

[56] References Cited

UNITED STATES PATENTS

| | | | |
|---|---|---|---|
| 3,197,710 | 7/1965 | Lin | 330/17 X |
| 3,573,645 | 4/1971 | Wheatley | 330/15 |

*Primary Examiner*—Herman Karl Saalbach
*Assistant Examiner*—James B. Mullins
*Attorney, Agent, or Firm*—Craig and Antonelli

[57] ABSTRACT

A transistor circuit suitable for a quasi-complementary circuit comprises first and second lateral type PNP transistors wherein both the emitter electrodes are connected in common, both the base electrodes are connected with the collector electrode of the second transistor, and an input signal is applied to the base electrodes.

10 Claims, 4 Drawing Figures

TRANSISTOR CIRCUIT

This invention relates to a transistorized circuit which comprises a plurality of transistors and operates as an equivalent transistor having a small current amplification factor.

The conventional quasi-complementary output circuit, an example of which has been described in U.S. Pat. No. 3,197,710, is shown in FIG. 1. In the conventional quasi-complementary output circuit current-amplification factors of an N-type first equivalent transistor T*n* and a P-type second equivalent transistor T*p* are unbalanced because a phase inverter transistor T1 is connected at the first stage of the P-type second equivalent transistorized circuit T*p*. The PNP transistor T1, which is formed by integrated circuit manufacturing techniques, is a lateral type and its $h_{fe}$ is relatively smaller than that of the vertical type transistors T2 to T5. For example, the $h_{fe}$ of a lateral type transistor lies in a range of 5 to 15, while that of a vertical type transistor lies in a range of 50 to 70. As a result it is difficult to balance the $h_{fe}$ of the N-type transistorized circuit and that of the P-type transistorized circuit.

Therefore, in the conventional quasi-complementary circuit there exists a problem that the distortion in an output signal is enlarged due to the unbalance of the current amplification factors.

It is an object of the present invention to provide a transistorized circuit, the current amplification factor of which is approximately 1.

It is another object of the present invention to provide a transistorized circuit which can be applied to a level shift circuit or a phase inverter circuit.

It is a further object of the present invention to provide a transistorized circuit which can be easily manufactured by integrated circuit manufacturing techniques and is especially suited for audio power amplifiers.

In accordance with one embodiment of the present invention, a first and a second transistor of the same conductivity type are prepared. To a connecting point of a base electrode of the first transistor, and the collector and base electrodes of the second transistor an electric voltage is applied. Emitter electrodes of the first and second transistors are connected to a common terminal and an output is led out from the collector electrode of the first transistor.

These and other objects, features and advantages of the present invention will become more apparent when taken in conjunction with the following description and drawings in which.

Figure 2:
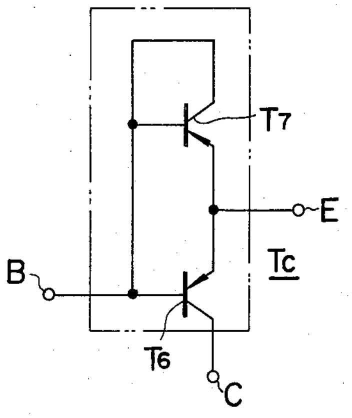
FIG. 2 is a circuit diagram of a transistorized circuit in accordance with the present invention.

Referring now to the drawings, wherein like reference letters are used throughout the various views to designate like parts, and more particularly to FIG. 2, there are shown a first transistor T6 of PNP type, a second transistor T7 of PNP type, an input terminal B connected to the base electrode of the first transistor T6 and to the base and collector electrodes of the second transistor T7. An output terminal C is connected to the collector electrode of the first transistor T6, and a common terminal E is connected to the emitter electrodes of the first transistor T6 and the second transistor T7.

The transistorized circuit of FIG. 2 operates as a PNP equivalent transistor Tc having a small $h_{fe}$. The input terminal B serves as a base terminal, the common terminal E as an emitter terminal and the output terminal C as a collector terminal. As can be seen from the following description, the $h_{fe}$ of the equivalent transistor Tc is approximately 1. The emitter currents of the first transistor T6 and the second transistor T7 are respectively expressed as $h_{fe6}\cdot ib_6 + ib_6$ and $h_{fe7}\cdot ib_7 + ib_7$, and the collector currents of the first transistor T6 and the second transistor T7 are respectively expressed as $h_{fe6}\cdot ib_6$ and $h_{fe7}\cdot ib_7$, where $h_{fe6}$ represents the current amplification factor of the first transistor T6 when an electric voltage applied between the terminal C and E is substantially higher than that applied between the terminals B and E, $h_{fe7}$ represents the current amplification factor of the second transistor T7 when the terminals C and B are electrically short-circuited, and $ib_6$ and $ib_7$ respectively represent the base currents of the first transistor T6 and the second transistor T7.

An electric current flowing into the input terminal B can be described by $(h_{fe7}+1)\cdot ib_7 + ib_6$, and the collector current of the first transistor T6 obtained from the output terminal C becomes $h_{fe6}\cdot ib_6$. Consequently, the current amplification factor $H_{fe}$ of the equivalent transistor Tc is obtained by the following formula:

$$H_{fe} = (h_{fe6}\cdot ib_6)/[(h_{fe7}+1)\cdot ib_7 + ib_6] \tag{1}$$

It is assumed that $ib_6$ is approximately equal to $ib_7$ since the emitter electrodes of the first and second transistors are connected in common and the base electrodes of the first and second transistors are connected in common. Utilizing the above assumption and simplification, formula (1) may be expressed as follows:

$$H_{fe} = h_{fe6}/(h_{fe7}+2) \tag{2}$$

Furthermore, since $h_{fe7}$ is significantly larger than 2, $H_{fe}$ may be written approximately as:

$$H_{fe} \approx h_{fe6}/h_{fe7} \approx 1 \tag{3}$$

Figure 1:
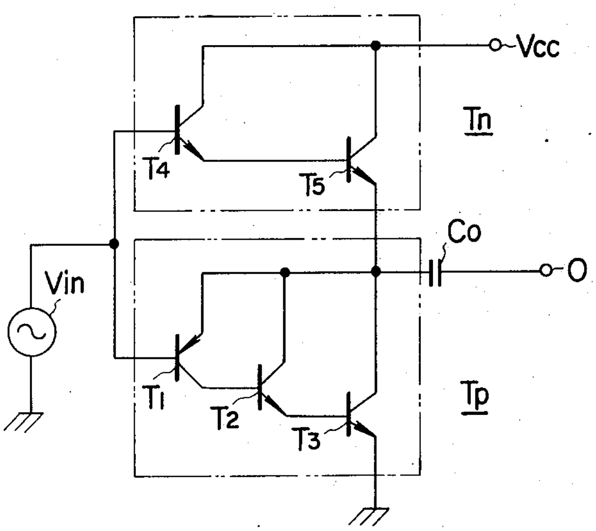
FIG. 1 PRIOR ART
FIG. 1 is a circuit diagram showing one example of the conventional transistorized circuit.
Figure 3:
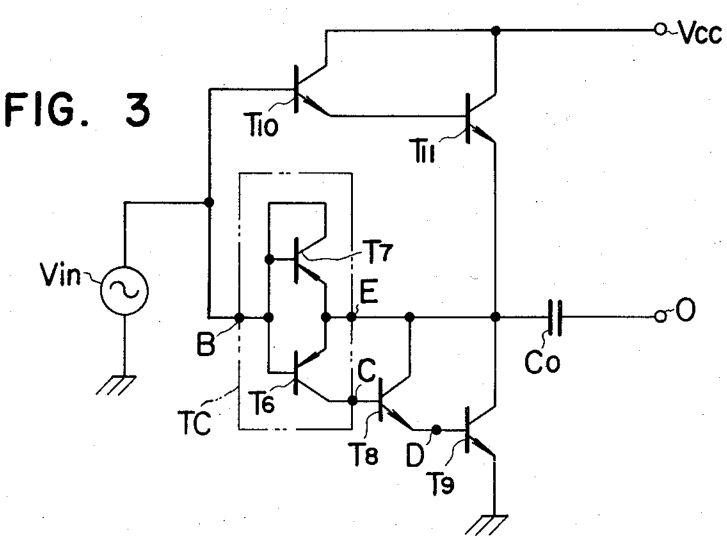
FIG. 3 is a circuit diagram of a quasi-complementary single and bushel circuit using a transistorized circuit of the present invention.

FIG. 3 shows one example of a quasi-complementary circuit using the transistorized circuit of FIG. 1, wherein reference letters T8 and T9 are vertical type NPN transistors which are connected in Darlington connection, reference letters T10 and T11 are also vertical type NPN transistors connected in Darlington connection. Reference letter Tc is the transistorized circuit comprising lateral type PNP transistors T6 and T7. The emitter terminal E and collector terminal C thereof are respectively connected to the collector and base of the transistor T8, and the base terminal thereof is coupled to an input signal source V*in* together with the base of the transistor T10. Also connected are an electric power source V*cc*, a condenser C*o*, an output terminal O and an emitter electrode D of the transistor T8. The circuit of FIG. 3 differs from the conventional circuit shown in FIG. 1 in that the transistorized circuit Tc, comprising the first and second transistors T6 and T7, is provided in place of the transistor T1 shown in FIG. 1.

Since the current amplification factor of the transistorized circuit Tc is approximately equal to 1, the difference of the current amplification factors between the transistorized circuit constituted of the Darlington-connected transistors T4 and T5 and the transistorized circuit of Darlington-connected transistors T2 and T3 can be reduced, whereby any distortion caused in an output signal is eliminated. Also, by eliminating the unnecessary gain of the PNP transistors constituting the complementary circuit, stable circuit operation is attained without causing an oscillation phenomenon.

Figure 4:
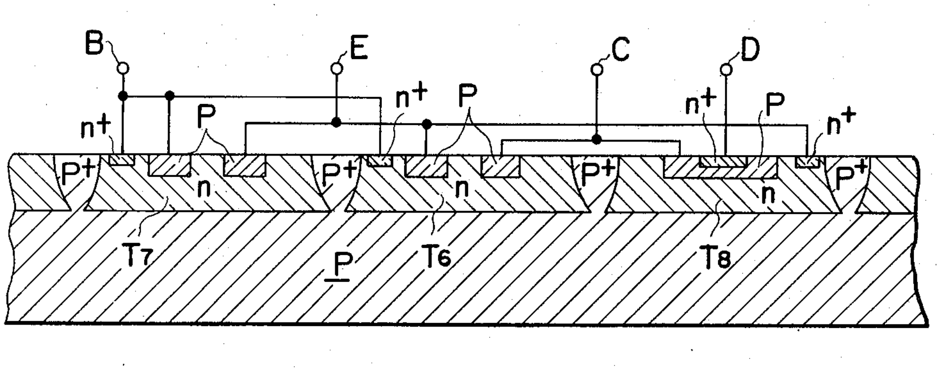
FIG. 4 is a cross-sectional view of a principal part of a monolithic integrated circuit embodying the quasi-complementary single and bushel circuit of FIG. 3.

FIG. 4 shows a schematic cross-section of a chief portion of a monolithic integrated circuit device embodying the circuit of FIG. 3. The first and second transistors T6 and T7 are lateral type PNP transistors and the transistor T8 is a vertical type NPN transistor. The first and second transistors T6 and T7 are simultaneously formed with the formation of the vertical type NPN transistor T8.

As can be seen from the foregoing description according to the present invention the transistorized circuit, the current amplification factor of which is approximately 1, can be obtained. The present invention is effectively applied especially to a quasi-complementary circuit, but it also is applicable to a level shift circuit or a phase inverter. A further advantage of the present transistorized circuit is that it can be easily constructed by integrated circuit manufacturing techniques. Although in the embodiments shown PNP type transistors are used for the first and second transistors T6 and T7, NPN type transistors can be also used, namely, it is important that the first and the second transistors T6 and T7 are of the same conductivity type.

What we claim is:

1. A quasi-complementary circuit comprising:

a first and a second transistor circuit each being a lateral type PNP transistor;

a third and a fourth transistor circuit each including vertical type NPN transistors, each transistor circuit having an emitter, a base and a collector electrode;

means for connecting the emitter electrodes of said first and second transistor circuits in common;

means for connecting the base electrode of said first transistor circuit with the base and the collector electrodes of said second transistor circuit;

means for connecting the collector electrode of said first transistor circuit with the base electrode of said third transistor circuit;

substantially zero impedance means for connecting the emitter electrodes of said first and second transistor circuits with the collector electrode of said third transistor circuit;

means for electrically connecting the emitter electrode of said fourth transistor circuit to the collector electrode of said third transistor circuit;

means for supplying an input signal in common to the base electrodes of said first, second and fourth transistor circuits;

means for supplying a voltage potential to the collector electrode of said fourth transistor circuit; and means for supplying a reference potential to the emitter electrode of said third transistor circuit.

2. In a quasi-complementary circuit including:

a first transistor circuit having a base electrode, an emitter electrode, and a collector electrode;

a second transistor circuit having a base electrode, an emitter electrode, and a collector electrode;

a third transistor circuit having a base electrode, an emitter electrode, and a collector electrode, the transistor regions to which the respective electrodes of said first and second transistor circuits are connected being of the same conductivity type, while the transistor regions to which the respective electrodes of said third transistor are connected having a conductivity type opposite that to which the electrodes of said first and second transistor circuits are connected;

first means for connecting the base electrodes of said first and third transistor circuits together;

second means for connecting the emitter electrode of said first transistor circuit to the collector electrode of said second transistor circuit;

third means having substantially zero impedance for connecting the collector electrode of said second transistor circuit to the emitter electrode of said third transistor circuit; and fourth means for connecting the base electrode of said second transistor circuit to the collector electrode of said third transistor circuit;

the improvement wherein:

said third transistor circuit comprises a first transistor having a base region, an emitter region, and a collector region;

a second transistor having a base region, an emitter region, and a collector region, the respective regions of said second transistor having the same conductivity type as the corresponding respective regions of said first transistor;

means for electrically connecting the emitter region of said first transistor to the emitter region of said second transistor; and means for electrically connecting the base region of said first transistor to the base and collector regions of said second transistor.

3. The improvement according to claim 2, wherein each of said first and second transistor circuits comprises a Darlington-connected pair of transistors.

4. The improvement according to claim 2, further including means for coupling an input signal to the base electrodes of said first and third transistor circuits, means for coupling a first bias potential to the collector electrode of said first transistor circuit, means for coupling a second reference potential to the emitter electrode of said second transistor circuit, and means for coupling an output from the collector electrode of said second transistor circuit.

5. In a quasi-complementary circuit comprising a first, a second and a third transistor, said first and second transistors being of the same conductivity type and said third transistor being of the conductivity type opposite to that of said first and second transistors, means for connecting the collector of said third transistor with the base of said second transistor, substantially zero impedance means for connecting the emitter of said third transistor with the collector of said second transistor, means for connecting the base of said first transistor with the base of said third transistor, and means for connecting said first transistor and the combination of said second and third transistors with each other so as to function complementarily, the improvement wherein the dircuit further comprises a fourth transistor of the same conductivity type as that of said third transistor, means for connecting the emitter and the base of said fourth transistor with the emitter and the base of said third transistor, respectively, and means for connecting the base of said fourth transistor with the collector thereof.

6. A circuit according to claim 5, wherein said first and second transistors are of the NPN type, and said third and fourth transistors are of the lateral PNP NPN type.

7. A circuit according to claim 5, further comprising a fifth and a sixth transistor of the same conductivity type as that of said first and second transistors and means for connecting each of the combination of said first and fifth transistors and the combination of said second and sixth transistors together, so as to be arranged as a Darlington pair.

8. A circuit according to claim 7, further including means for connecting the emitter of said fifth transistor with the collector of said sixth transistor, means for supplying a voltage potential to the collector of said fifth transistor, and means for supplying a reference potential to the emitter of said sixth transistor.

9. A circuit according to one of claim 7, further including an input terminal connected to the junction of the bases of said first and third transistors, and an output terminal connected to the junction of the emitter of said fifth transistor and the collector of said sixth transistor.

10. A quasi-complementary circuit comprising:

a first and a second transistor circuit each being a lateral type PNP transistor;

a third and a fourth transistor circuit each including vertical type NPN transistors, each transistor circuit having an emitter, a base and a collector electrode;

the emitter electrodes of said first and second transistor circuits being connected in common;

the base electrode of said first transistor circuit being connected in common with the base and the collector electrodes of said second transistor circuit;

the collector electrode of said first transistor circuit being connected in common with the base electrode of said third transistor circuit;

the emitter electrodes of said first and second transistor circuits being connected in common with the collector electrode of said third transistor circuit;

the emitter electrode of said fourth transistor circuit being connected in common with the collector electrode of said third transistor circuit;

means for supplying an input signal in common to the base electrodes of said first, second and fourth transistor circuits;

means for supplying a voltage potential to the collector electrode of said fourth transistor circuit; and means for supplying a reference potential to the emitter electrode of said third transistor circuit.

* * * * *